United States Patent [19]

Lamberg

[11] Patent Number: 4,940,953
[45] Date of Patent: Jul. 10, 1990

[54] MILLIMETER WAVE MICROSTRIP IMPATT DIODE OSCILLATOR

[75] Inventor: John R. Lamberg, Minnetonka, Minn.
[73] Assignee: Honeywell Inc., Minneapolis, Minn.
[21] Appl. No.: 402,664
[22] Filed: Sep. 5, 1989
[51] Int. Cl.$^5$ .............................................. H03B 7/14
[52] U.S. Cl. .................................. 331/96; 331/107 DP; 331/107 SL; 333/232; 333/246
[58] Field of Search ............ 331/96, 107 DP, 107 SL; 333/232, 247

[56] References Cited

U.S. PATENT DOCUMENTS

| | | | |
|---|---|---|---|
| 3,680,002 | 7/1972 | Quine | 331/107 G |
| 4,019,161 | 4/1977 | Kimura et al. | 333/82 B |
| 4,149,127 | 4/1979 | Murakami et al. | 331/96 |
| 4,259,647 | 3/1981 | Chang et al. | 331/96 |
| 4,426,628 | 1/1984 | Malecki et al. | 331/96 |
| 4,431,974 | 2/1984 | Landt | 331/107 DP |
| 4,459,564 | 7/1984 | Janton | 331/96 |
| 4,494,086 | 1/1985 | Dydyk | 331/96 |
| 4,581,591 | 4/1986 | Jacobs et al. | 331/96 |

Primary Examiner—Siegfried H. Grimm
Attorney, Agent, or Firm—Haugen and Nikolai

[57] ABSTRACT

A millimeter wave microstrip oscillator utilizing either a pulsed or CW IMPATT diode as the active element provides relatively high power output not available with a GUNN diode. The circuit comprises a block of a conductive metal having a channel of rectangular cross-section formed therein and including a cylindrical well formed inwardly in the block from the floor of the channel. A packaged IMPATT diode of either the pulsed or CW variety fits into the well with the cap portion of the package coplanar with the microstrip circuit pattern when the microstrip rests on the floor of the channel. The pattern includes a shunt open circuit stub and an impedance transformer connected to the terminals of the IMPATT diode for effectively matching the diode's complex impedance with the load. A conductive cover is secured to the block and a laterally and vertically movable tuning screw passes through the cover for fine tuning the oscillator's output frequency and power. The circuit is capable of producing CW or pulsed signals with appropriate choice of IMPATT diode bias signal (pulsed or DC), microstrip circuit pattern dimensions and tuning screw diameter and position.

5 Claims, 1 Drawing Sheet

MILLIMETER WAVE MICROSTRIP IMPATT DIODE OSCILLATOR

GOVERNMENT RIGHTS

The U.S. Government has contributed to the design and development of this invention and, therefore, has obtained certain rights therein.

BACKGROUND OF THE INVENTION

I. Field of the Invention

This invention relates generally to very high frequency oscillators for use in radar and communications applications, and more particularly to a millimeter wave microstrip oscillator employing a relatively high power IMPATT diode as its active element.

II. Discussion of the Prior Art

In certain radar communications applications, a need exists for a high frequency carrier oscillator which will develop a power output in the range of 0.5 to 1.5 watts. Other workers have taken advantage of the higher power output available from IMPATT diodes as compared to GUNN diodes but, for the most part, it has necessitated the use of waveguides. There are many applications where size and space constraints will not permit waveguide technology to be employed. Moreover, it is known in the art that high frequency oscillators can be implemented using GUNN diodes in combination with microstrip circuitry. While this combination may solve the space and environmental problems posed by waveguides, they have necessarily employed GUNN diodes as the active element in that the GUNN diode does not present the same problem in matching its internal impedance to the transmission line impedances with which the oscillator is utilized. IMPATT diodes, on the other hand, can provide a substantially greater power output than an oscillator centered on the use of a GUNN diode but, because of the very small negative resistance characteristic of the IMPATT diode, it is difficult to efficiently match that device to a load using microstrip technology.

One of the criteria for oscillation is that the absolute value of the negative resistance of the diode be greater than the transformed load resistance and that the reactance of the diode be the complex conjugate of the transformed load reactance. Because of the small device resistance, it is somewhat difficult, utilizing microstrip technology to provide the necessary impedance matching to affect efficient oscillation.

The Dydyk U.S. Pat. No. 4,494,086 describes a microstrip oscillator in which an IMPATT diode is employed as its active element. The Dydyk circuit arrangement, while it takes advantage of the higher power characteristics of IMPATT diodes, is limited in terms of its ability to provide a variable output frequency. That is to say, the output frequency in the Dydyk circuit is determined by the dimensions of the printed circuit resonator pattern which, for any given circuit, is a fixed parameter.

SUMMARY OF THE INVENTION

Accordingly it is a principal object of the present invention to provide a new and improved microstrip oscillator incorporating an IMPATT diode as its active element.

Another object of the invention is to provide a new and improved microstrip oscillator permitting ease of frequency and power adjustment over a limited band.

Another object of the invention is to provide a microstrip oscillator for use in millimeter wave applications which provides relatively high power output.

The foregoing objects, features and advantages of the invention are achieved by first providing an oscillator housing in the form of a conductive block in which a channel of rectangular cross-section is formed. In the base of the channel is a cylindrical well for receiving a packaged IMPATT diode therein. The bottom of the channel is overlaid with a dielectric substrate supporting a ground plane on one side thereof and a microstrip pattern on the other. The usual metal cap of the packaged IMPATT diode is connected to the microstrip circuitry via a soldered copper strap. Affixed to the conductive block and functioning as a cover is a conductive plate. A conductive tuning post protrudes through the cover into the channel near the IMPATT diode. Means are provided for adjusting the lateral and vertical position of the post. By manipulating the orientation of the post relative to the IMPATT diode, both the power output and the frequency of oscillation can be adjusted within limits.

Further in accordance with the present invention, the microstrip circuitry includes a two-section impedance transformer and a shunt-connected open-circuited stub to conjugate match the load impedance to that of the IMPATT diode. Bias is applied to the diode by way of a printed bias filter which functions as a choke for the fundamental frequency. A printed DC block is used to isolate the RF output from the bias supply.

The oscillator built in accordance with the foregoing successfully produces continuous wave (CW) or pulsed outputs upon use of the appropriate IMPATT diode and bias circuit, and adjustment of the microstrip matching and tuning element dimensions.

The foregoing and other objects and advantages of the present invention will become apparent to those skilled in the art upon consideration of the accompanying specification and claims, especially when considered in conjunction with the accompanying drawings.

DESCRIPTION OF THE PREFERRED EMBODIMENT

Figure 1:
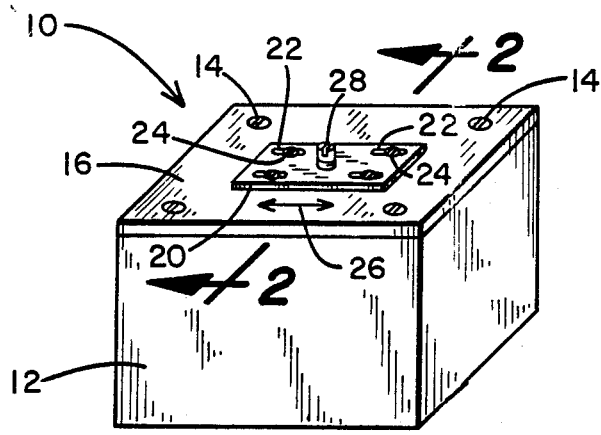
FIG. 1 is a perspective view of a microstrip oscillator in accordance with the teachings of the present invention.

Referring first to FIG. 1, there is indicated generally by numeral 10 a microstrip oscillator fabricated in accordance with the present invention. It is seen to include a block 12 of conductive material, e.g., brass, and secured to the top surface thereof by a series of screws 14 is a cover plate 16. The cover plate 16 includes a longitudinal slot 18 (FIG. 2) which is overlaid by a slide plate 20. The slide plate includes a plurality of elongated slots, as at 22, through which fasteners 24 extend so that when the fasteners are loose, the plate 20 can be shifted longitudinally back and forth as indicated by the double-headed arrow 26. A threaded bore is formed through the slide plate 20 for receiving the threaded shaft of a tuning screw 28.

Figure 2:
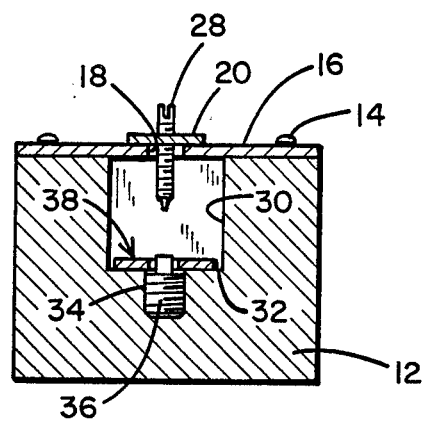
FIG. 2 is a cross-sectional view taken along the lines 2—2 in the microstrip oscillator of FIG. 1.

With reference to FIG. 2, it can be seen that there is formed inwardly into the conductive block 12 a channel 30 of generally rectangular cross-section and that the tuning screw 28 is made to project into this channel by an adjustable distance. The channel has a floor surface 32 and drilled downwardly from that surface is a cylindrical bore 34 which receives a packaged IMPATT diode 36 therein.

Figure 3:
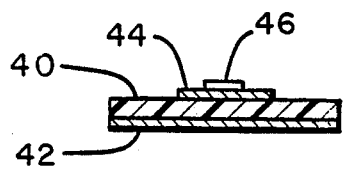
FIG. 3 is a cross-sectional view of the microstrip substrate.
Figure 4:
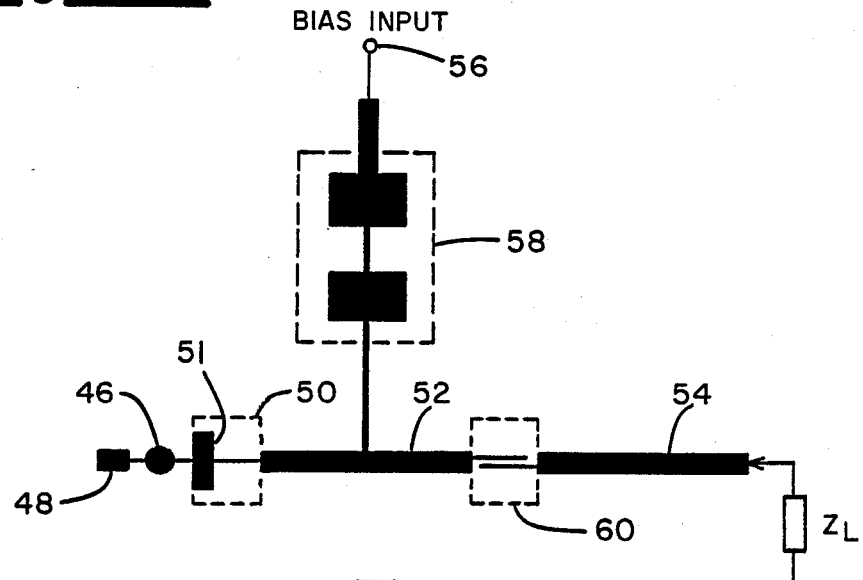
FIG. 4 is a greatly enlarged plan view of the microstrip pattern used in the oscillator of FIG. 1.

Resting upon the floor surface 32 of the channel 30 is a microstrip circuit indicated generally by numeral 38. As can best be seen in FIG. 3, the microstrip circuit comprises an insulating substrate 40 having a conductive ground plane 42 adhered to the undersurface thereof and an etched conductive pattern 44 adhered to the upper surface. The particular shape of the etched pattern is shown in the plan view of FIG. 4. Referring to FIG. 4, the cap of the IMPATT diode is identified by numeral 46 and is seen to pass through a bore formed in the insulating substrate 40 (FIG. 2) so as to be generally coplanar with the pattern conductor 44. Conductive straps are then used to join the IMPATT diode terminals first to an open circuit shunt stub 48 and then to an impedance transforming circuit shown enclosed by the broken line box 50. A strip transmission line 52 and 54 couples the high frequency oscillator output to a complex load $Z_L$. The matching circuit 50 in conjunction with the open circuit stub 48 and the tuning screw 28 transforms the load so as to satisfy the criteria for oscillation.

Bias is applied at an input terminal 56 and passes through a high frequency choke or bias filter 58. A DC block 60 precludes the bias from reaching the load $Z_L$.

It is a characteristic of the IMPATT diode that its negative resistance is very small compared to the transmission line impedances. As such, it is difficult to efficiently match an IMPATT diode using a microstrip configuration. By proper dimensioning of the shunt stub 48 and the impedance transformer 50 and by including the tuning screw 28, the absolute value of the IMPATT's diode's negative resistance can be made greater than the transformed load resistance, and the reactance of the IMPATT diode can be made equal to the complex conjugate of the transformed load reactance. Fine tuning of the oscillator can be accomplished by a combination of laterally shifting the tuning screw 28 relative to the cap of the IMPATT diode 36 and/or by varying the vertical distance between the end of the tuning screw and that cap.

The cover plate 16 serves to limit radiation of energy from the oscillator so that a minimum power is lost in delivering it to the load.

An oscillator made in accordance with the present invention using a pulsed IMPATT diode rated for 12 W in a waveguide cavity is capable of producing a 9 watt output at 35 GHz for a pulsed application by adjusting the microstrip shunt stub 48, matching transformer 50 and the tuning element 28. Fine tuning of frequency and power is accomplished by manipulating the tuning screw 28.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A millimeter wave, microstrip IMPATT diode oscillator comprising:
   (a) a block of conductive material having a channel of rectangular cross-section formed therein and with a well of a predetermined diameter formed inwardly of said block from the floor of said channel;
   (b) a packaged IMPATT diode fitted into said well, said IMPATT diode including a metallized cap projecting out of said well and into said channel;
   (c) a microstrip circuit including a dielectric substrate resting on said channel floor, said dielectric substrate including a hole for receiving said metallized cap therethrough and a pattern of printed circuit conductors on the surface opposite that resting on said channel floor;
   (d) means connecting said metallized cap of said IMPATT diode to said pattern of printed circuit conductors;
   (e) a conductive cover secured to said block and overlaying said channel; and
   (f) a laterally and vertically adjustable post passing through said cover and into said channel for cooperating with said pattern of printed circuit conductors for adjusting the output of said oscillator.

2. The oscillator as in claim 1 wherein said pattern of printed circuit conductors includes a two-section impedance transformer and a shunt connected open circuited stub for conjugate matching a load impedance to said packaged IMPATT diode.

3. The oscillator as in claim 2 wherein said pattern of printed circuit conductors further includes a bias filter for blocking the transmission of high frequency signals to a source of bias potential and a printed DC block for isolating the flow of bias current to the load while effectively delivering the high frequency oscillator output to said load.

4. The oscillator as in claims 1, 2 or 3 wherein said packaged IMPATT diode is a pulsed IMPATT diode.

5. The oscillator as in claims 1, 2 or 3 wherein said packaged IMPATT diode is a continuous wave (CW) IMPATT diode.

* * * * *